US009900000B2

(12) United States Patent
Kanamori et al.

(10) Patent No.: US 9,900,000 B2
(45) Date of Patent: Feb. 20, 2018

(54) DRIVE DEVICE

(71) Applicant: DENSO CORPORATION, Kariya, Aichi-pref. (JP)

(72) Inventors: Atsushi Kanamori, Kariya (JP); Sadahiro Akama, Kariya (JP); Kiyoshi Yamamoto, Kariya (JP); Atsushi Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 30 days.

(21) Appl. No.: 15/117,487

(22) PCT Filed: Mar. 12, 2015

(86) PCT No.: PCT/JP2015/001364
§ 371 (c)(1),
(2) Date: Aug. 9, 2016

(87) PCT Pub. No.: WO2015/146039
PCT Pub. Date: Oct. 1, 2015

(65) Prior Publication Data
US 2017/0104479 A1    Apr. 13, 2017

(30) Foreign Application Priority Data

Mar. 27, 2014  (JP) ................................. 2014-066593
Oct. 20, 2014  (JP) ................................. 2014-213590

(51) Int. Cl.
*H03K 17/14*    (2006.01)
*H03K 17/16*    (2006.01)
*H03K 17/28*    (2006.01)

(52) U.S. Cl.
CPC ........... *H03K 17/14* (2013.01); *H03K 17/165*
(2013.01); *H03K 17/168* (2013.01); *H03K*
*17/28* (2013.01)

(58) Field of Classification Search
CPC ...................................................... H03K 17/14
See application file for complete search history.

(56) References Cited

U.S. PATENT DOCUMENTS

| | | | |
|---|---|---|---|
| 6,870,421 B2 * | 3/2005 | Abe ........................ | H03F 3/343 327/513 |
| 9,800,237 B2 * | 10/2017 | Akama ............. | H03K 17/0406 |
| 2007/0115038 A1 | 5/2007 | Higashi et al. | |
| 2009/0066402 A1 | 3/2009 | Hiyama | |

(Continued)

FOREIGN PATENT DOCUMENTS

| | | |
|---|---|---|
| JP | 2001-314075 A | 11/2001 |
| JP | 2003-158868 A | 5/2003 |

(Continued)

*Primary Examiner* — Hai L Nguyen
(74) *Attorney, Agent, or Firm* — Posz Law Group, PLC

(57) ABSTRACT

A drive device for controlling a power switching element to turn on and off includes: an on-side circuit performing an on operation of the power switching element; an off-side circuit performing an off operation of the power switching element; and a temperature detector detecting a temperature. At least one of the on-side and off-side circuits includes a current path for supplying or drawing a gate current of the power switching element and a switch circuit for switching the gate current. The switch circuit transitionally changes the gate current based on the temperature of the power switching element when the switching circuit switches the gate current.

10 Claims, 9 Drawing Sheets

(56) References Cited

U.S. PATENT DOCUMENTS

| | | |
|---|---|---|
| 2010/0148846 A1 | 6/2010 | Hiyama |
| 2013/0214823 A1 | 8/2013 | Kawamoto et al. |
| 2015/0035569 A1 | 2/2015 | Miura et al. |

FOREIGN PATENT DOCUMENTS

| | | |
|---|---|---|
| JP | 2008-054098 A | 3/2008 |
| JP | 2013-192305 A | 9/2013 |
| WO | 2015/146038 A1 | 10/2015 |
| WO | 2015/155962 A1 | 10/2015 |

* cited by examiner ic power conversion device such as an Inverter or a converter.

DRIVE DEVICE

CROSS REFERENCE TO RELATED APPLICATION

This application is a U.S. national stage of International Application No. PCT/JP2015/001364 filed on Mar. 12, 2015 and is based on Japanese Patent Application No. 2014-66593 filed on Mar. 27, 2014, and No. 2014-213590 filed on Oct. 20, 2014, the disclosures of which are incorporated herein by reference.

TECHNICAL FIELD

The present disclosure relates to a drive device that performs an on/off operation of a power switching element taking into consideration temperature characteristics.

BACKGROUND ART

There is known active gate control (AGC) which actively controls a gate voltage or a gate current as a technique for eliminating a trade-off between a surge voltage and a switching loss during a switching operation in a power switching element that constitutes a semiconductor power conversion device such as an Inverter or a converter.

For example, when an insulated gate bipolar transistor (IGBT) is used as a power switching element, a change with time dV/dt of a collector-emitter voltage (hereinbelow, referred to as a collector voltage Vce) during turning-off is fed back to control a discharging speed of a gate charge of the IGBT. Specifically, Patent Literature 1 proposes a technique for switching the discharging speed of the gate charge of the IGBT in the middle of discharge.

As the switching timing, for example, when the switching is performed at the timing when the collector voltage Vce reaches a power supply voltage VB, it is possible to reduce the switching loss while reducing surges.

However, dV/dt in a power switching element such as an IGBT typically has a temperature dependence. Thus, the switching timing of the discharging speed of the gate charge in the power switching element changes by the temperature of the power switching element.

For example, Patent Literature 2 proposes a technique for adjusting a feedback amount of dV/dt according to the temperature of the power switching element as a drive circuit that takes into consideration the temperature characteristics of the power switching element. Specifically, a feedback resistance (base-GND resistance) of a transistor for turning-off is made variable according to the temperature. Accordingly, it is possible to control the discharging speed of the gate charge according to the temperature.

However, the technique of Patent Literature 2 defines the discharging speed of the gate charge, that is, defines the drive capacity according to the temperature of the power switching element, and cannot eliminate the trade-off between the surge voltage and the switching loss. Further, even when the technique described in Patent Literature 2 and the technique described in Patent Literature 1 are combined, it is difficult to optimize the switching timing of the discharging speed. Thus, an effect of reducing the switching loss is not sufficient.

PRIOR ART LITERATURES

Patent Literature

Patent Literature 1: Japanese Patent No. 3885563
Patent Literature 2: Japanese Patent No. 4904993

SUMMARY OF INVENTION

It is an object of the present disclosure to reduce the switching loss caused by temperature. A drive device for controlling a power switching element to turn on and off includes: an on-side circuit that performs an on operation of the power switching element; an off-side circuit that performs an off operation of the power switching element; and a temperature detector that detects a temperature of the power switching element. At least one of the on-side circuit or the off-side circuit includes a current path for supplying or drawing a gate current of the power switching element and a switch circuit for switching the gate current of the power switching element. The switch circuit transitionally changes the gate current based on the temperature of the power switching element detected by the temperature detector when the switching circuit switches the gate current.

For example, when the temperature of the power switching element is higher than an ordinary temperature, a change with time (inclination) of the collector voltage Vce is slowed down. That is, a value of dV/dt becomes small. Thus, for example, in a turning-off operation, a time required for the collector voltage Vce to rise and then return to a steady-state value after overshoot after the start of the tuning-off operation becomes longer than that at the ordinary temperature. Thus, the switching loss, that is, the product of the collector voltage Vce and the collector current Ic becomes large.

The above drive device transitionally changes the gate current on the basis of the temperature of the power switching element. Thus, in the switching of the gate current, it is possible to transitionally change the amount of the gate charge. Thus, it is possible to prevent a rapid reduction of the inclination dV/dt of the collector voltage in the switching of the gate current. In other words, it is possible to correct the slowdown of dV/dt caused by the temperature of the power switching element. Thus, it is possible to reduce the switching loss caused by the temperature of the power switching element.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinbelow, embodiments of the present disclosure will be described with reference to the drawings. Identical reference signs designate identical or equivalent parts throughout the following drawings.

First Embodiment

First, a drive device according to a first embodiment will be described with reference to FIG. 1.

Figure 1:
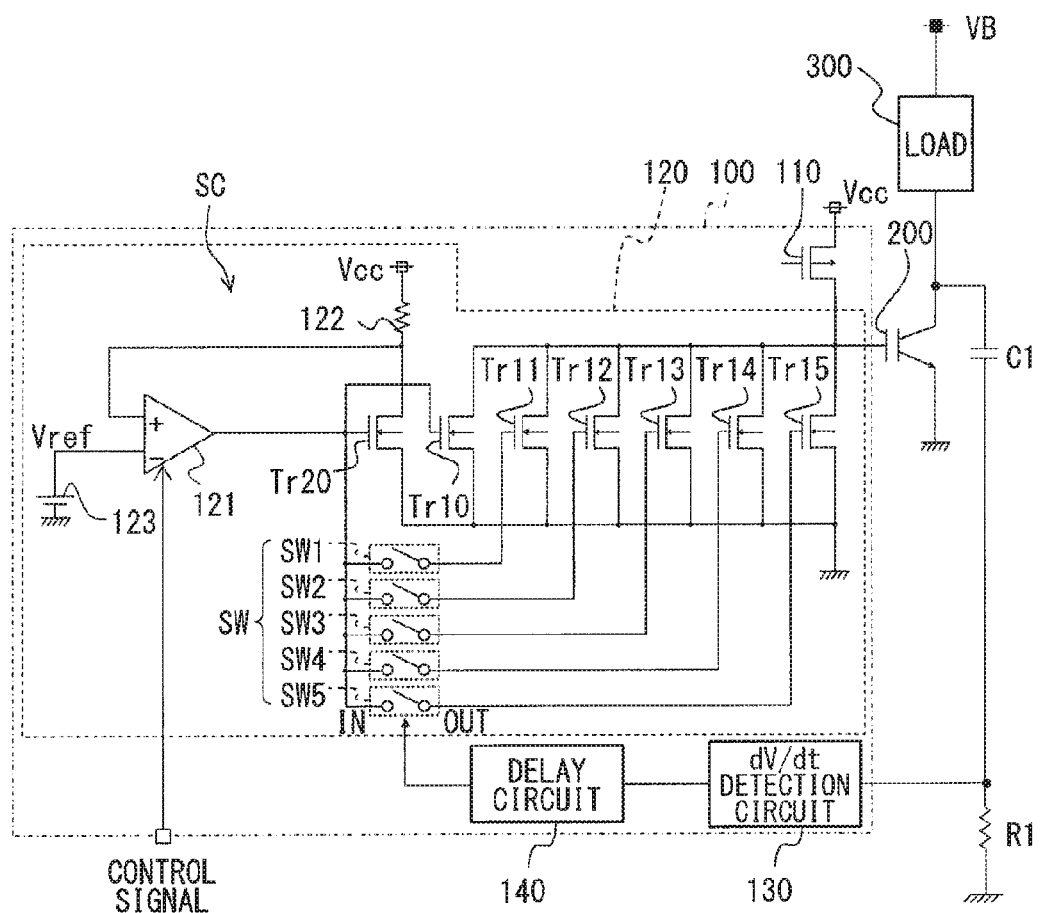
FIG. 1 is a circuit diagram illustrating a schematic configuration of a drive device according to a first embodiment.

As illustrated in FIG. 1, the drive device 100 controls the drive of an insulated gate bipolar transistor (IGBT) 200 as a power switching element which drives a load 300.

The drive device 100 includes an on-side circuit 110, an off-side circuit 120, a dV/dt detection circuit, and a delay circuit 140.

The on-side circuit 110 and the off-side circuit 120 are connected in series between a power supply and the GND. A gate of the IGBT 200 is connected to an intermediate point between the on-side circuit 110 and the off-side circuit 120. The on-side circuit 110 includes a PMOS transistor. When the PMOS transistor is in an on state, a power supply voltage Vcc is applied to the gate of the IGBT 200. Accordingly, the IGBT 200 is turned on, and a current flows between a collector and an emitter of the IGBT 200, so that power is supplied to the load.

The off-side circuit 120 includes a plurality of NMOS transistors (Tr10 to Tr15, Tr20). These NMOS transistors include main MOS transistors (Tr10 to Tr15) as output transistors and a sense MOS transistor Tr20 which defines drain currents of the main MOS transistors. In the present embodiment, the six main MOS transistors (Tr10 to Tr15) constitute a current mirror with respect to the sense MOS transistor Tr20. Specifically, a gate of each of the main MOS transistors (Tr10 to Tr15) is common with a gate of the sense MOS transistor Tr20, and sources thereof are connected in common to the GND. A drain of each of the main MOS transistors (Tr10 to Tr15) is connected to the gate of the IGBT 200.

In such a configuration, a drain current flows through each of the main MOS transistor (Tr10 to Tr15) with a current ratio that is equal to a size ratio of the sense MOS transistor Tr20. That is, in the present embodiment, there are six current paths for a current drawn from the gate of the IGBT 200. The size described herein is an aspect ratio (W/L) between a channel width W and a channel length L in the MOS transistor.

The off-side circuit 120 includes an operational amplifier 121 for controlling a drain current of the sense MOS transistor Tr20, a reference resistor 122 for defining an output of the operational amplifier 121, and a reference power supply 123 which applies a reference potential Vref to one input terminal of the operational amplifier 121. When a control signal indicating turning-off of the IGBT 200 is input to the operational amplifier 121 from a microcomputer (not illustrated), the operational amplifier 121 applies a voltage to the gate of the sense MOS transistor Tr20 so as to draw a constant current from the gate of the IGBT 200.

The reference resistor 122 is a shunt resistor and defines a current value of the drain current of the sense MOS transistor Tr20. Further, the reference resistor 122 defines a current value of the current drawn from the gate of the IGBT 200. The current drawn from the gate of the IGBT 200 is the sum of drain currents flowing through the main MOS transistors (Tr10 to Tr15). The main MOS transistors (Tr10 to Tr15) constitute the current mirror together with the sense MOS transistor Tr20. Thus, the current drawn from the gate of the IGBT 200 depends on the drain current of the sense MOS transistor Tr20.

In such a configuration, when a control signal indicating turning-off of the IGBT 200 is input, the operational amplifier 121 is driven to apply a gate voltage to the sense MOS transistor Tr20. A drain current at this time is defined by a resistance value R of the reference resistor 122. The current value is feedback-controlled by adjusting the output of the operational amplifier 121 so that an intermediate potential between the reference resistor 122 and the sense MOS transistor Tr20 approaches the reference potential Vref. Accordingly, the drain current of the sense MOS transistor Tr20 is controlled at a constant value (=Vref/R) with high accuracy. Thus, the current drawn from the gate of the IGBT 200 is also maintained at a constant current with high accuracy. In the present embodiment, a sense current control circuit SC corresponds to a circuit that includes the operational amplifier 121, the reference resistor 122, and the reference power supply 123.

The off-side circuit 120 further includes switch circuits (SW1 to SW5) for switching a current value of the current drawn from the gate of the IGBT 200, that is, for switching a drive capacity. The switch circuits (SW1 to SW5) are respectively connected to the gates of the five main MOS transistors (Tr11 to Tr15) in the six main MOS transistors (Tr10 to Tr15). For example, when the switch circuit SW1 is enabled and the other switch circuits (SW2 to SW5) are disabled, a gate charge of the IGBT 200 is drawn by a current defined by the main MOS transistors Tr10 and Tr11. That is, it is possible to control the drive capacity of the off-side circuit 120 depending on which one of the switch circuits (SW1 to SW5) is enabled. The five switch circuits (SW1 to SW5) are equivalent to each other. Thus, hereinbelow, the switch circuits are collectively designated by a reference sign SW except when each of the switch circuits is individually described. A detailed circuit configuration of the switch circuit SW in the present embodiment will be described below.

The dV/dt detection circuit 130 in the drive device 100 detects a change with time dV/dt of a collector voltage Vce of the IGBT 200. Specifically, the dV/dt detection circuit 130 is connected to an intermediate point between a capacitor C1 and a resistor R1 which are connected in series between the collector of the IGBT 200 and the GND to constitute a differentiator. When a control signal indicating turning-off of the IGBT 200 is input to the operational amplifier 121, the gate charge of the IGBT 200 is drawn to increase the collector voltage Vce. Thus, dV/dt has a value other than zero. The dV/dt detection circuit 130 detects this state, and outputs the detected result to the delay circuit 140.

The delay circuit 140 operates the switch circuit SW with a delay by a predetermined delay time from a point when dV/dt starts rising. Which one of the five switch circuits (SW1 to SW5) is to be operated may be previously determined or determined according to a value of dV/dt.

Figure 2:
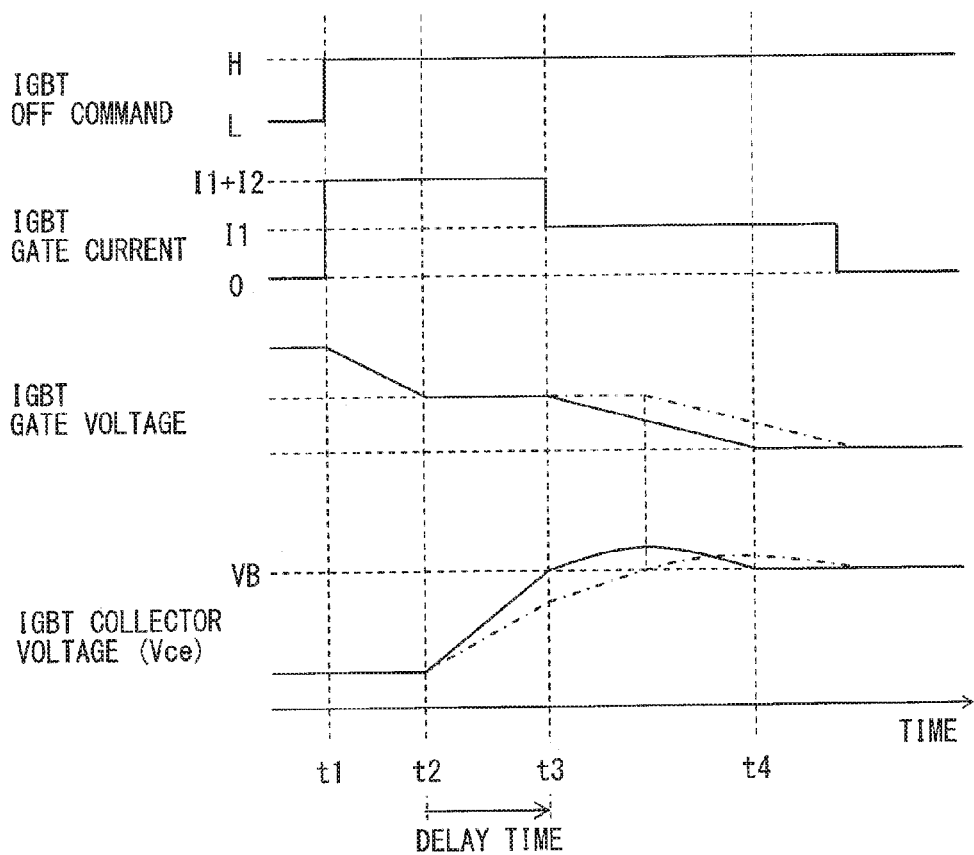
FIG. 2 is a timing chart illustrating driving by the drive device.

Next, driving for switching a charge discharging speed during a discharge period of the gate charge of the IGBT 200 as performed in the drive device 100 of the present embodiment will be described with reference to FIG. 2.

At a time t1, a control signal indicating turning-off of the IGBT 200 is input to the operational amplifier 121. Accordingly, as illustrated in FIG. 2, the operational amplifier 121 is driven to draw a current from the gate of the IGBT 200. In this description, in the switch circuits SW at the time t1, the switch circuit SW1 is enabled (on) and the switch circuits SW2 to SW5 are disabled (off). That is, the current drawn from the gate has a total value I1+I2 of a drain current I1 of the main MOS transistor Tr10 and a drain current I2 of the main MOS transistor Tr11.

When the charge drawing from the gate of the IGBT 200 is started, the gate voltage decreases. Then, at a time t2, when the gate voltage decreases down to a predetermined potential, a collector current Ic of the IGBT 200 starts decreasing, and the collector voltage Vce starts rising. That is, at the point of time t2, dV/dt is increased to a positive value from approximately zero. The dV/dt detection circuit 130 detects this state, and outputs the detected result to the delay circuit 140.

Then, at a time t3 after the delay time previously defined by the delay circuit 140, the switch circuit SW1 is turned off to be disabled. Accordingly, the gate current of the IGBT 200 is switched from I1+I2 to I1. That is, the drive capacity of the off-side circuit 120 is reduced to reduce the discharging speed of the gate charge. Thus, dV/dt immediately after the time t3 is smaller than dV/dt immediately before the time t3. As a result, the overshoot of the collector voltage Vce is reduced, and an effect of reducing a surge voltage can be exhibited. Then, at a time t4, the collector voltage Vce converges to a steady-state value, and the off operation of the IGBT 200 is finished.

Here, a case in which the IGBT 200 is in a high-temperature state will be described. The change dV/dt of the collector voltage of the IGBT 200 depends on the temperature. As the temperature increases, dV/dt decreases. Thus, as indicated by a dot-dash line of FIG. 2, a rate of increase in the collector voltage Vce after the time t2 is reduced. Further, after the reduction in the drive capacity of the off-side circuit 120 after the time t3, the rate of increase in the collector voltage Vce is further reduced. Thus, a time required for the collector voltage Vce to reach a steady-state value is increased, which disadvantageously increases the switching loss.

In order to solve such a problem, the switch circuit SW in the drive device 100 is configured to reduce a reduction in dV/dt caused by temperature.

Figure 3:
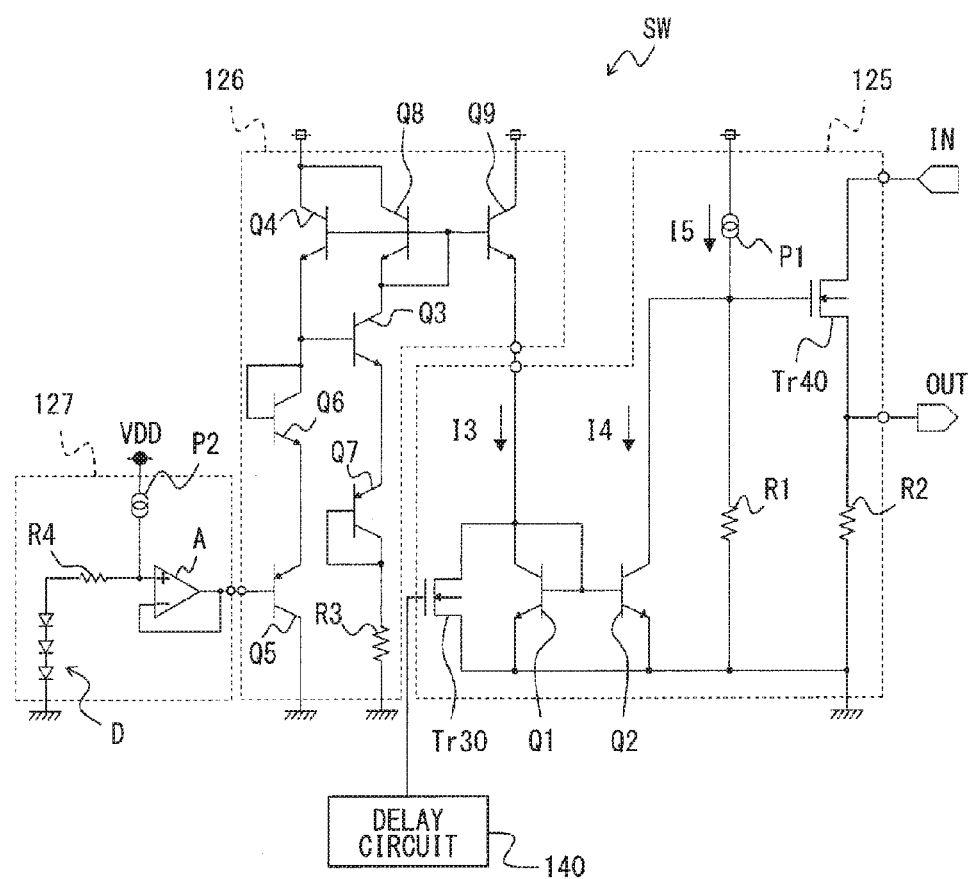
FIG. 3 is a circuit diagram illustrating a detailed configuration of a switch circuit.
Figure 4:
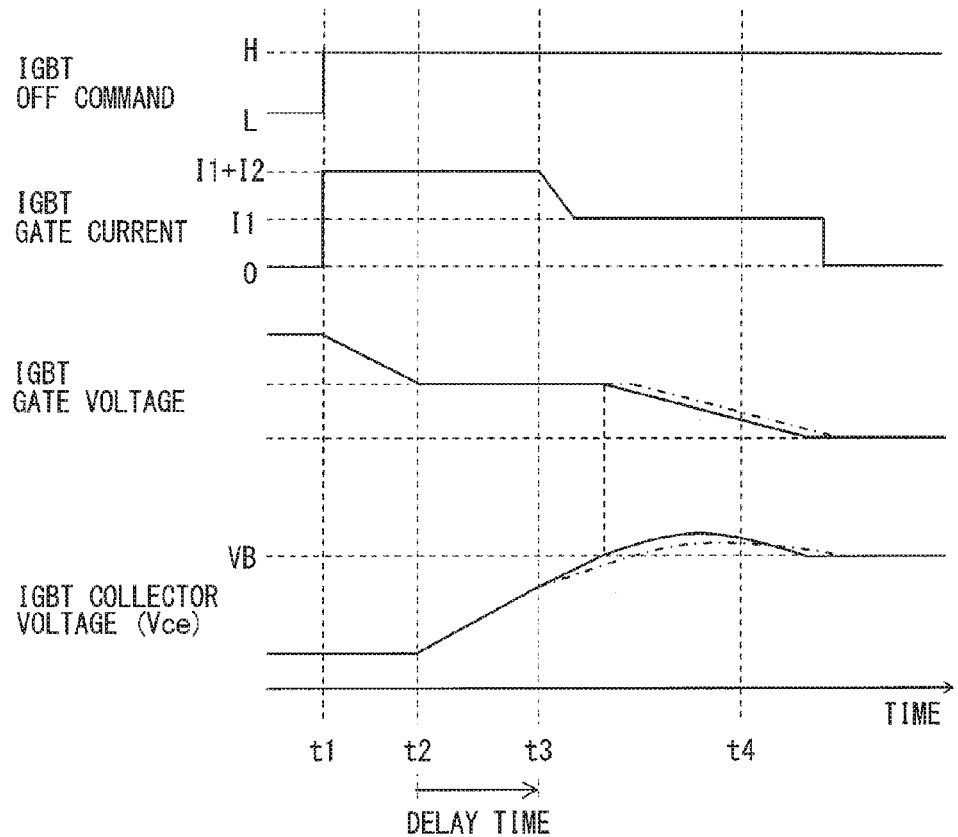
FIG. 4 is a timing chart illustrating driving by the drive device.

A detailed configuration and effects of the switch circuit SW in the present embodiment will be described with reference to FIGS. 3 and 4. All the switch circuits (SW1 to SW5) have the same configuration as illustrated in FIG. 3.

The switch circuit SW includes a main circuit 125, a constant-current circuit 126, and a temperature characteristic adjustment circuit 127.

The main circuit 125 performs the passage and interruption of a current between an input terminal IN and an output terminal OUT in accordance with a signal from the delay circuit 140. As illustrated in FIG. 3, the main circuit 125 includes a MOS transistor Tr30 which performs an on/off operation in response to a signal from the delay circuit 140. The main circuit 125 further includes two NPN transistors Q1, Q2 which are connected to the constant-current circuit 126 in parallel to the MOS transistor Tr30 and constitute a current mirror so as to mirror a current I3 input from the constant-current circuit 126. The main circuit 125 further includes a MOS transistor Tr40 which performs the passage and interruption of a current between the input terminal IN and the output terminal OUT in accordance with a current injected to the gate. The main circuit 125 further includes a current source P1 which injects a current to the gate of the MOS transistor Tr40 to turn on the switch circuit SW. In the present embodiment, the input terminal IN illustrated in FIG. 3 is connected to an output terminal of the operational amplifier 121, and the output terminal OUT is connected to the gate of the main MOS transistor (Tr11 to Tr15).

An operation of the main circuit 125 will be described. When the switch circuit SW is turned on, a signal indicating turning-on of the MOS transistor Tr30 is input from the delay circuit. In this state, the current I3 from the constant-current circuit 126 flows as a drain current of the MOS transistor Tr30, and no current flows through the NPN transistors Q1, Q2 which constitute the current mirror. That is, a current I4 illustrated in FIG. 3 does now flow. Thus, a current I5 from the current source P1 is injected to the gate of the MOS transistor Tr40 to turn on the MOS transistor Tr40, so that a current is passed between the input terminal IN and the output terminal OUT. That is, the switch circuit SW is turned on. The resistor R1 inserted between the current source P1 and the GND is a resistor for defining a gate voltage of the MOS transistor Tr40 in a steady state.

On the other hand, when the switch circuit SW is turned off, a signal indicating turning-off of the MOS transistor Tr30 is input from the delay circuit. In this state, the drain current of the MOS transistor Tr30 does not flow, and the current I3 Input to the main circuit 125 from the constant-current circuit 126 is mirrored by the NPN transistors Q1, Q2, so that the current I4 illustrated in FIG. 3 flows. The current I4 flows so as to draw the current I5 injected by the current source P1 and the gate charge of the MOS transistor Tr40. Thus, the MOS transistor Tr40 is turned off. Accordingly, the current between the input terminal IN and the output terminal OUT is interrupted to turn off the switch circuit SW. When the switch circuit SW is turned off, the gate of the corresponding main MOS transistor presents a high impedance. The switch circuit SW in the present embodiment includes a pull-down resistor R2 which is inserted between the output terminal OUT and the GND to ensure a reliable off operation of the switch circuit SW.

The constant-current circuit 126 is a circuit for supplying the constant current I3 to the main circuit 125. As illustrated in FIG. 3, the constant-current circuit 126 forms a commonly known circuit configuration for applying a constant current. Specifically, the constant-current circuit 126 includes an NPN transistor Q3, and an NPN transistor Q4 and a PNP transistor Q5 which are connected in parallel to a base of the NPN transistor Q3 and function as resistors. A resistor R3 is connected between an emitter of the NPN transistor Q3 and the GND. This configuration allows a constant collector current defined by resistance values of the NPN transistor Q4, the PNP transistor Q5, and the resistor R3 to flow through the NPN transistor Q3. The current is mirrored by NPN transistors Q8, Q9 which constitute a current mirror to supply the current I3 to the main circuit 125. An NPN transistor Q6 and a PNP transistor Q7 are inserted for respectively reducing the temperature characteristics of the resistance values of the resistor R3 and the PNP transistor Q5.

In this manner, the current I3 is defined by the resistance values of the NPN transistor Q4, the PNP transistor Q5, and the resistor R3. In the constant-current circuit 126 in the present embodiment, the resistance values of the NPN transistor Q4 and the resistor R3 are constant. Thus, the current I3 depends on an on-resistance of the PNP transistor Q5.

The temperature characteristic adjustment circuit 127 is a circuit for applying a voltage corresponding to the temperature of the IGBT 200 to the base of the PNP transistor Q5 in the constant-current circuit 126. The temperature characteristic adjustment circuit 127 includes a temperature sensing diode D which is connected to a current source P2 in series with the resistor R4 and disposed near the IGBT 200 and an operational amplifier A which constitutes a buffer circuit. Specifically, the temperature characteristic adjustment circuit 127 is configured in such a manner that an output is negatively fed back to one input terminal of the operational amplifier A, and a voltage depending on a voltage drop caused by the temperature sensing diode D is applied to the other input terminal of the operational amplifier A. Thus, the output of the operational amplifier A depends on the voltage drop caused by the temperature sensing diode D. Typically, the resistance of the temperature sensing diode D decreases as the temperature increases, and the voltage drop amount is reduced. Thus, as the temperature of the IGBT 200 increases, a voltage applied to the base of the PNP transistor Q5 in the constant-current circuit 126 is reduced. The current I3 is determined by a value obtained by dividing the base voltage of the PNP transistor Q5 by the resistance value of the resistor R3. Thus, as the temperature of the IGBT 200 increases, the current I3 is reduced.

In this manner, in the switch circuit SW in the present embodiment, as the temperature of the IGBT 200 increases, a value of the current I4 for drawing the gate charge from the gate of the MOS transistor Tr40 is reduced, and the charge discharging speed is reduced. That is, an off speed of the switch circuit SW has a temperature dependence. Thus, when the gate current of the IGBT 200 is switched from I1+I2 to I1, the gate current transitionally changes as indicated by a solid line in FIG. 4. That is, the temperature sensing diode D corresponds to a temperature detector. Accordingly, the collector voltage Vce can make dV/dt after the time t3 larger than that in a case in which the off speed of the switch circuit SW has no temperature dependence. Thus, it is possible to reduce a time required for the collector voltage Vce to reach a steady-state value after overshoot to reduce the switching loss. A dot-dash line in FIG. 4 indicates a change in each electric characteristic value in the IGBT 200 when the off speed of the switch circuit SW has no temperature dependence.

First Modification

In the above example, the gate current of the IGBT 200 is switched by turning off the switch circuit SW1 from a state in which only the switch circuit SW1 is in an on state. In other words, in the above example, the number of switching stages of the gate current is two. However, the present disclosure is not limited to this example. That is, the number of switching stages of the gate current may be three or more.

Figure 5:
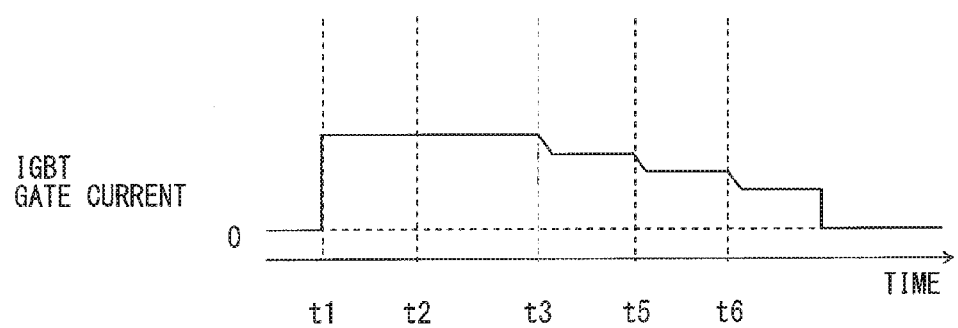
FIG. 5 is a timing chart illustrating driving by a drive device in a first modification.

For example, as illustrated in FIG. 5, control may be performed in such a manner that the switch circuits SW1 to SW3 are in an on state at the point of time t1, the switch circuit SW3 is turned off at the time t3, the switch circuit SW2 is turned off at a time t5, and the switch circuit SW1 is turned off at a time t6.

Accordingly, it is possible to achieve a smoother transition of the gate current than the transition in the two switching stages of the gate current. Thus, it is possible to further reduce an increase in the switching loss caused by the temperature characteristics of the IGBT 200.

Second Embodiment

In the above embodiment, the control based on the temperature of the IGBT 200 is enabled in the off-side circuit 120. The control can also be applied to the on-side circuit 110.

Figure 6:
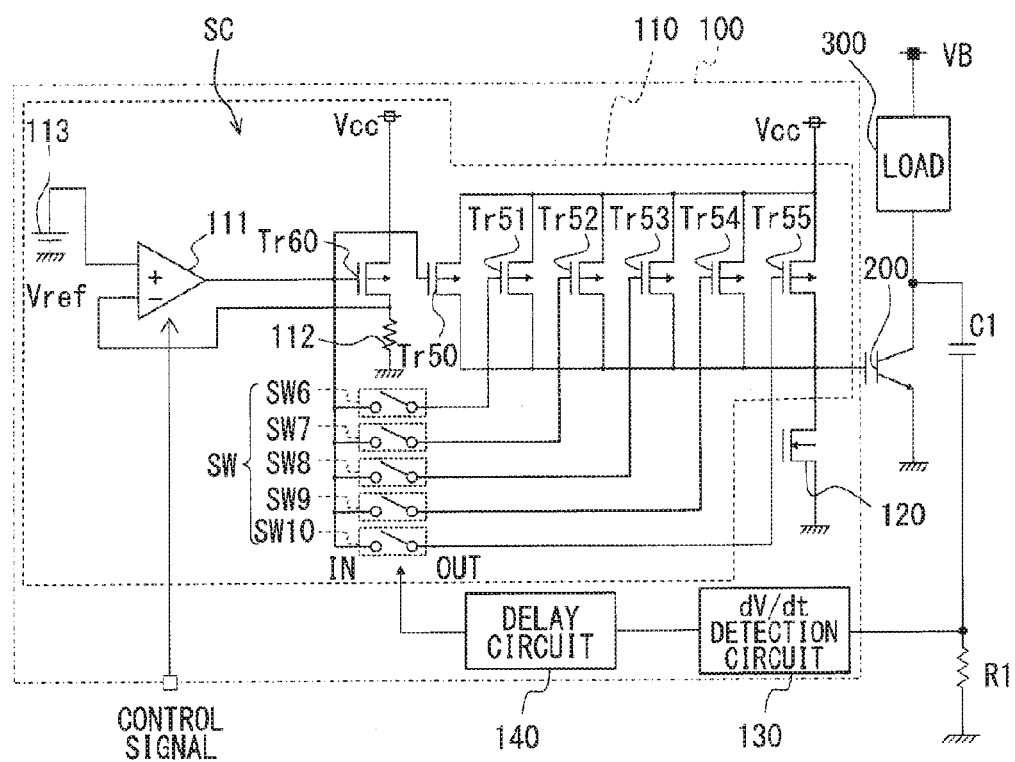
FIG. 6 is a circuit diagram illustrating a schematic configuration of a drive device according to a second embodiment.

Specifically, as illustrated in FIG. 6, the on-side circuit 110 includes a plurality of PMOS transistors (Tr50 to Tr55, Tr60). These PMOS transistors include main MOS transistors (Tr50 to Tr55) as output transistors and a sense MOS transistor Tr60 which defines drain currents of the main MOS transistors. In the present embodiment, the six main MOS transistors (Tr50 to Tr55) constitute a current mirror with respect to the sense MOS transistor 760. Specifically, a gate of each of the main MOS transistors (Tr50 to Tr55) is common with a gate of the sense MOS transistor Tr60, and drains thereof are connected in common to a power supply Vcc. A source of each of the main MOS transistors (Tr50 to Tr55) is connected to the gate of the IGBT 200.

The on-side circuit 110 includes an operational amplifier 111 for controlling a drain current of the sense MOS transistor Tr60, a reference resistor 112 for defining an output of the operational amplifier 111, and a reference power supply 113 which applies a reference potential Vref to one input terminal of the operational amplifier 111. When a control signal indicating turning-on of the IGBT 200 is input from a microcomputer (not illustrated), the operational amplifier 111 applies a voltage to the gate of the sense MOS transistor Tr60 so as to supply a constant current to the gate of the IGBT 200.

The on-side circuit 110 further includes switch circuits (SW6 to SW10) for switching a current value of the current supplied to the gate of the IGBT 200, that is, for switching a drive capacity. The switch circuits (SW6 to SW10) are respectively connected to the gates of the five main MOS transistors (Tr51 to Tr55) in the six main MOS transistors (Tr50 to Tr55). The switch circuits (SW6 to SW10) are equivalent to the switch circuits SW described in the first embodiment. The circuit configuration illustrated in FIG. 3 can be employed as a circuit configuration of the switch circuits (SW6 to SW10).

The main MOS transistors (Tr50 to Tr55), the sense MOS transistor Tr60, the operational amplifier 111, the reference resistor 112, the reference power supply 113, and the switch circuits (SW6 to SW10) which are constituent elements in the present embodiment are elements respectively corresponding to the main MOS transistors (Tr10 to Tr15), the sense MOS transistor Tr20, the operational amplifier 121, the reference resistor 122, the reference power supply 123, and the switch circuits (SW1 to SW5) in the first embodiment. Thus, the operation and effects of each constituent element correspond to those in the first embodiment and the modification thereof. That is, when the IGBT 200 is turned on, a time required for the collector voltage Vce to reach a steady-state value after undershoot by a reduction thereof can be made shorter than that in a case in which the off speed of the switch circuit SW has no temperature dependence. Accordingly, the switching loss can be reduced.

The reference potential Vref in the present embodiment does not necessarily require agreement with the reference potential Vref in the first embodiment.

Third Embodiment

In the first embodiment, the six main MOS transistors (Tr10 to Tr15) are formed, there are the six current flow paths for drawing the gate charge, and the number of switching stages of the gate current is two (three or more in the modification).

Figure 7:
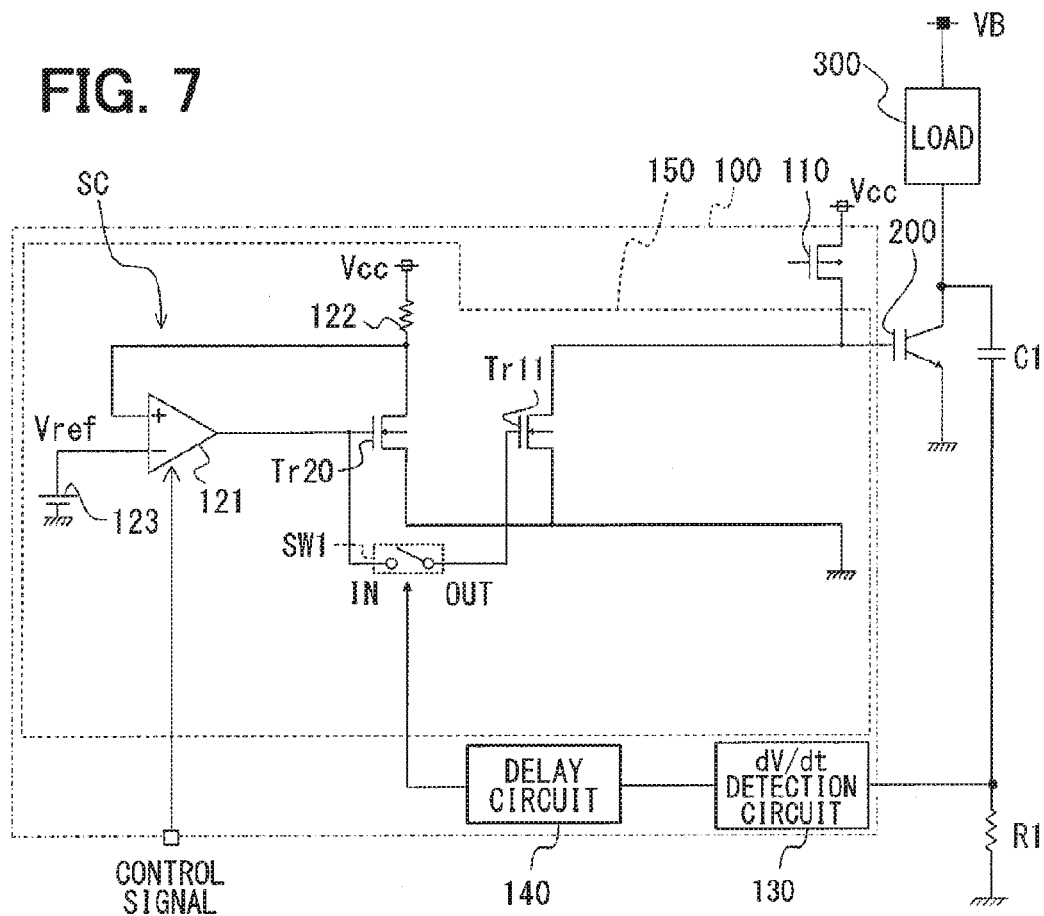
FIG. 7 is a circuit diagram illustrating a schematic configuration of a drive device according to a third embodiment.

On the other hand, in a third embodiment, a case having a single current path in an off-side circuit 150 will be described. Specifically, as illustrated in FIG. 7, the main MOS transistors (Tr10, Tr12 to Tr15) are removed from the off-side circuit 120 of the first embodiment and only the main MOS transistor Tr11 is provided. In accordance with this configuration, also the switch circuits SW2 to SW5 are not formed, and the switch circuit SW1 connects the operational amplifier 121 and the main MOS transistor Tr11 to each other. The other circuit configuration including the sense current control circuit SC is similar to that in the first embodiment.

Figure 8:
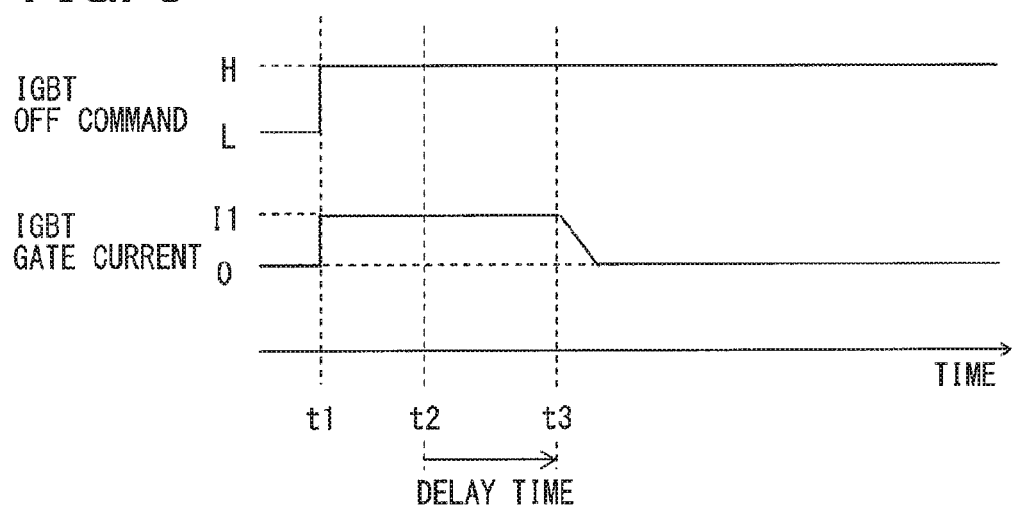
FIG. 8 is a timing chart illustrating driving by the drive device.

FIG. 8 is a timing chart in turning-off of the IGBT 200 in the present embodiment. A control signal for turning off the IGBT 200 and a delay time defined by the delay circuit 140 are similar to those of the first embodiment, and description of time is based on the description of the first embodiment (FIGS. 2 and 4).

In the present embodiment, in turning-off of the IGBT 200, the gate current is switched by one stage. Specifically, as illustrated in FIG. 8, control is performed in such a manner that the switch circuit SW1 is turned on at the point of time t1, and the switch circuit SW1 is turned off at the time t3. Accordingly, the gate current changes from I1 to zero. The off speed of the switch circuit SW1 has a temperature dependency. Thus, when the gate current of the IGBT 200 is switched from I1 to zero, as illustrated in FIG. 8, it is possible to transitionally change the gate current.

Fourth Embodiment

The sense current control circuit SC is not limited to a circuit that includes the operational amplifier 111, 121, the reference resistor 112, 122, and the reference power supply 113, 123.

In the sense current control circuit SC in each of the above embodiments, the feedback control is performed so as to have a current value defined by the resistance value R of the reference resistor 112, 122 and the reference potential Vref of the reference power supply 113, 123. On the other hand, a sense current control circuit SC in the present embodiment performs no feedback control.

Figure 9:
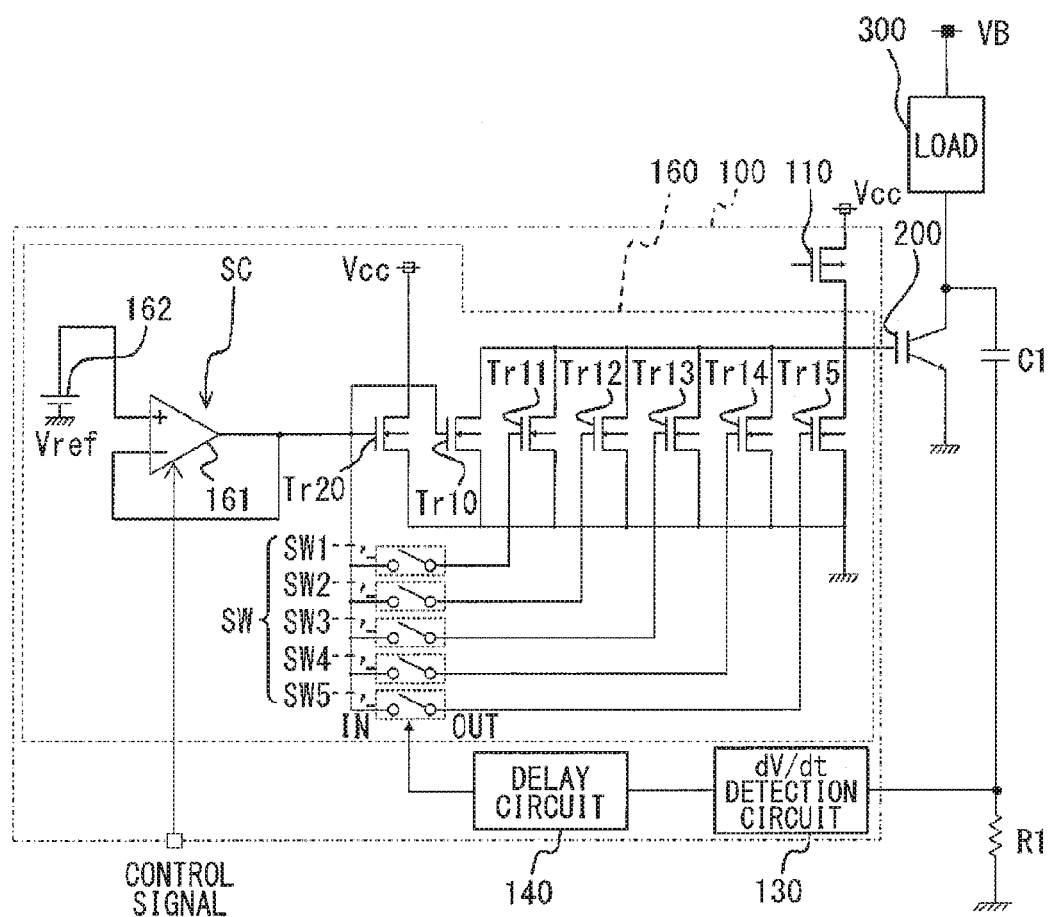
FIG. 9 is a circuit diagram illustrating a schematic configuration of a drive device according to a fourth embodiment.

As illustrated in FIG. 9, the sense current control circuit SC of an off-side circuit 160 in the present embodiment includes an operational amplifier 161 which includes an output terminal connected to a gate of a sense MOS transistor Tr20 and a reference power supply 162 which applies a predetermined voltage to one input terminal of the operational amplifier 161. An output of the operational amplifier 161 is negatively fed back to the other input terminal, so that a voltage defined by the reference power supply 162 is applied to the sense MOS transistor Tr20. Also in such a configuration, the output current can be switched by switching the number of main MOS transistors (Tr10 to Tr15) to be enabled. When the sense current control circuit SC as described in the first and second embodiments is employed, it is possible to maintain the drain current of the sense MOS transistor Tr20 with a higher accuracy than the present embodiment. However, when a load 300 which requires no high accuracy is driven, it is possible to reduce the number of components and manufacturing cost by employing the sense current control circuit SC according to the present embodiment.

Second Modification

Figure 10:
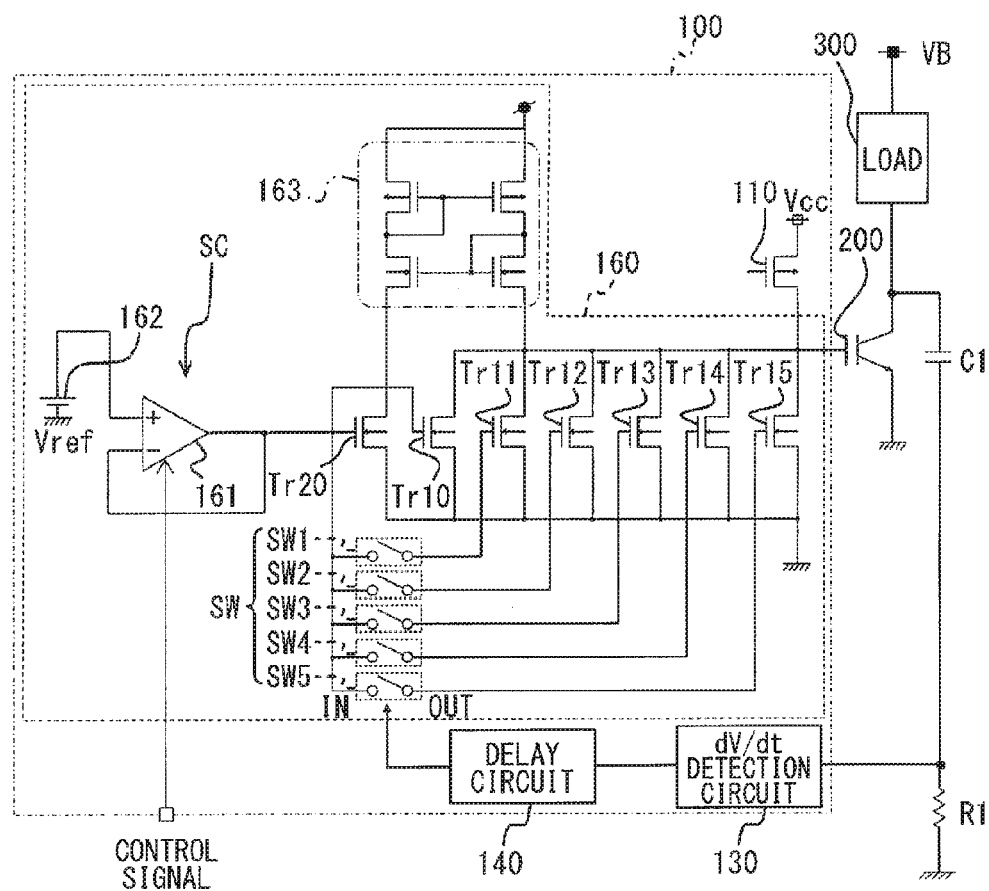
FIG. 10 is a circuit diagram illustrating a schematic configuration of a drive device according to a second modification.

As illustrated in FIG. 10, a Vds adjustment circuit 163 may be employed to highly accurately control a gate current supplied to the sense MOS transistor Tr20 and the main MOS transistors (Tr10 to Tr15) of the sense current control circuit SC in the fourth embodiment.

The Vds adjustment circuit 163 in the present modification is, for example, a Wilson current mirror circuit in which two current paths are connected to the drains of the sense MOS transistor Tr20 and the main MOS transistors (Tr10 to Tr15). Accordingly, a drain-source voltage Vds in each NMOS transistor is adjusted at a constant voltage. Thus, it is possible to more accurately control the drain current of each NMOS transistor.

Third Modification

The threshold voltage and the mobility of charges of the sense MOS transistor Tr20 and the main MOS transistors (Tr10 to Tr15) typically have temperature characteristics. Thus, the gate voltage of the IGBT 200 may change with a change in the temperature. The present modification employs a configuration that applies an appropriate temperature characteristic to the reference power supply 162 described in the fourth embodiment and the second modification as a sense current control circuit SC to reduce the change of the gate voltage.

Figure 11:
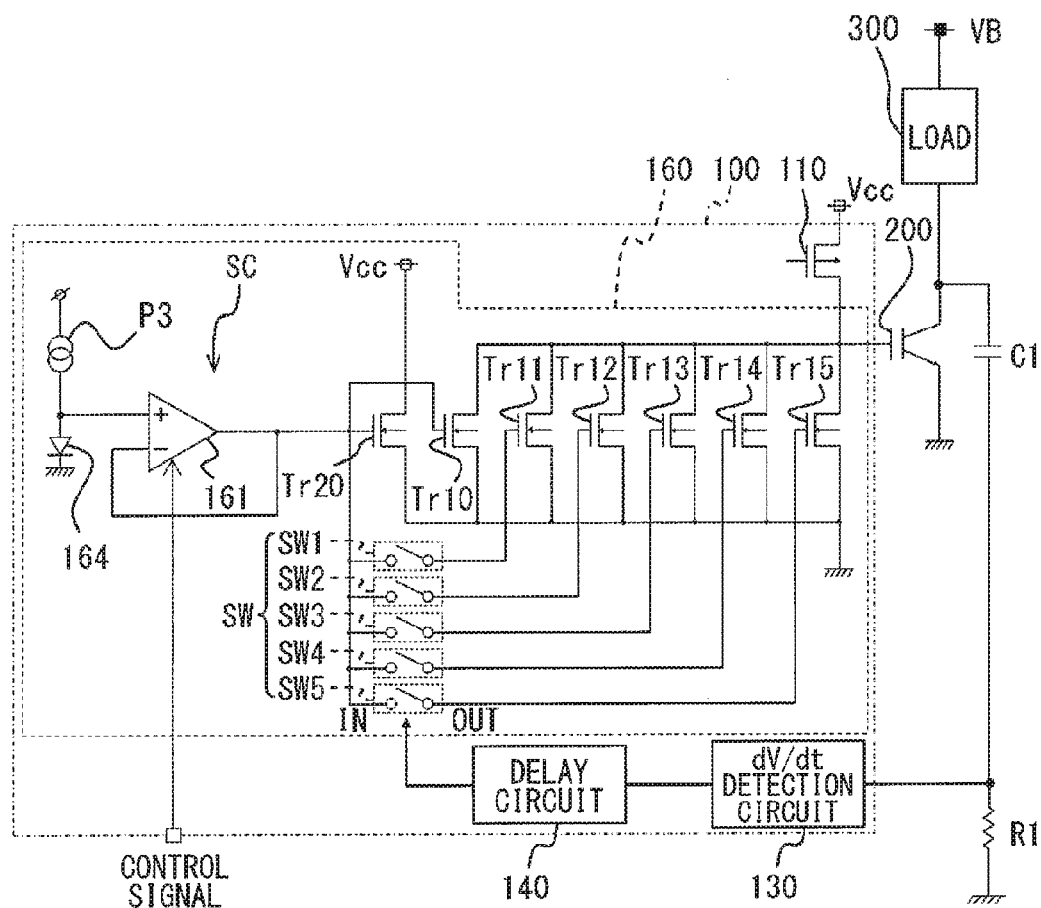
FIG. 11 is a circuit diagram illustrating a schematic configuration of a drive device according to a third modification.

Specifically, as illustrated in FIG. 11, the sense current control circuit SC of an off-side circuit 160 in the present embodiment includes an operational amplifier 161, a current source P3 which supplies a predetermined current to one input terminal of the operational amplifier 161, and a temperature sensitive element 164 which is connected to the operational amplifier 161 in parallel to the current source P3. The temperature sensitive element 164 in the present modification is, for example, a temperature sensing diode. The threshold voltage and the mobility of charges of each NMOS transistor typically has a negative temperature characteristic, and the voltage drop amount (Vf) of the temperature sensing diode also has a negative temperature characteristic. Thus, as illustrated in FIG. 11, the current source P3 and the temperature sensing diode are connected to a non-inversion input terminal of the operational amplifier 161, and the output of the operational amplifier 161 is negatively fed back to an inversion input terminal. Accordingly, it is possible to reduce the gate voltages of the sense MOS transistor Tr20 and the main MOS transistors (Tr10 to Tr15) along with an increase in the temperature of the drive device 100. That is, the change in the gate voltage of the IGBT 200 caused by temperature can be reduced. The temperature sensitive element 164 is not limited to a temperature sensing diode.

Other Embodiments

Although the preferred embodiments of the present disclose have been described above, the present disclosure is not limited at all to the above embodiments. The present disclosure can be performed with various modifications without departing from the gist of the present disclosure.

Although, in the above embodiments, a plurality of current paths which define the gate current of the IGBT 200 are formed by the current mirror, the present disclosure is not limited thereto. The present disclosure may be applied to an embodiment that switches a current path for switching the gate current during a period of the discharge of the gate charge of the IGBT 200.

Although, in the above embodiments, the temperature sensing diode D is used as the temperature detector for detecting the temperature of the IGBT 200, the present disclosure is not limited thereto. For example, the temperature detector may be any element whose output voltage varies corresponding to the temperature such as a thermistor.

The constant-current circuit 126 as illustrated in FIG. 3 has been described as an example of a circuit that supplies a constant current to the main circuit 125 in the switch circuit SW. However, the circuit is not limited to the above example, and may be configured in any manner as long as a current value to be output varies in response to the input from the temperature characteristic adjustment circuit 127.

Although, in the first embodiment, the on-side circuit 110 is composed of a PMOS transistor and the off-side circuit 120 is composed of an NMOS transistor, the relationship therebetween may be the reverse thereof. In this case, the outputs of the operational amplifier 111, 121 are inverted with respect to the above embodiment.

Although, in the fourth embodiment, the second modification, and the third modification, variations of the sense current control circuit SC with respect to the off-side circuit are described, these variations may also be applied to the on-side circuit 110.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A drive device for controlling a power switching element to turn on and off, the drive device comprising:
   an on-side circuit that performs an on operation of the power switching element;
   an off-side circuit that performs an off operation of the power switching element; and
   a temperature detector that detects a temperature of the power switching element, wherein:
   at least one of the on-side circuit or the off-side circuit includes a current path for supplying or drawing a gate current of the power switching element and a switch circuit for switching the gate current of the power switching element;
   the switch circuit transitionally changes the gate current based on the temperature of the power switching element detected by the temperature detector when the switching circuit switches the gate current;
   the off-side circuit includes:
      a plurality of main MOS transistors as output transistors that provide the current path;
      a sense MOS transistor that includes a gate in common with the main MOS transistors, and provides a current mirror with respect to the main MOS transistors to define a drain current of each main MOS transistor; and
      a sense current control circuit that controls a drain current of the sense MOS transistor to be constant;
   the switch circuit is connected to the gate of each of the main MOS transistors, and controls each of the main MOS transistors to turn on and off so as to switch the gate current in the power switching element; and
   the switch circuit controls an on-resistance of each of the main MOS transistors based on the temperature of the power switching element to transitionally change the gate current when the switching circuit switches the gate current.

2. The drive device according to claim 1, wherein:
   the current path includes at least two passages; and
   the gate current varies by switching between the at least two passages with the switching circuit.

3. The drive device according to claim 1, wherein:
   the sense current control circuit includes:
      a reference power supply that generates a reference potential;
      a reference resistor connected in series to the sense MOS transistor; and
      an operational amplifier that generates an output at the gate of the sense MOS transistor so that a potential between the reference resistor and the sense MOS transistor approaches the reference potential; and
   the sense current control circuit flows a current, determined by a resistance value of the reference resistor and the reference potential, as the drain current of the sense MOS transistor.

4. The drive device according to claim 1, wherein:
   the sense current control circuit includes:
      an operational amplifier that generates an output at the gate of the sense MOS transistor;
      a current source that supplies a predetermined current to one input terminal of the operational amplifier; and
      a temperature sensitive element connected to the operational amplifier in parallel to the current source; and
   the sense current control circuit changes the drain current of the sense MOS transistor based on a voltage drop in the temperature sensitive element that depends on temperature.

5. The drive device according to claim 1, wherein:
   the plurality of main MOS transistors include at least three transistors connected to each other so as to reduce the gate current in a stepwise manner; and
   the switch circuit transitionally changes the gate current when the switch circuit switches the gate current.

6. A drive device for controlling a power switching element to turn on and off, the drive device comprising:
   an on-side circuit that performs an on operation of the power switching element;
   an off-side circuit that performs an off operation of the power switching element; and
   a temperature detector that detects a temperature of the power switching element, wherein:
   at least one of the on-side circuit or the off-side circuit includes a current path for supplying or drawing a gate current of the power switching element and a switch circuit for switching the gate current of the power switching element;
   the switch circuit transitionally changes the gate current based on the temperature of the power switching element detected by the temperature detector when the switching circuit switches the gate current;
   the on-side circuit includes:
      a plurality of main MOS transistors as output transistors that provide the current path;
      a sense MOS transistor that includes a gate in common with the main MOS transistors, and provides a current mirror with respect to the main MOS transistors to define a drain current of each main MOS transistor; and a sense current control circuit that controls a drain current of the sense MOS transistor to be constant;

the switch circuit is connected to the gate of each of the main MOS transistors, and controls each of the main MOS transistors to turn on and off so as to switch the gate current in the power switching element; and the switch circuit controls an on-resistance of each of the main MOS transistors based on the temperature of the power switching element to transitionally change the gate current when the switch circuit switches the gate current.

7. The drive device according to claim 6, wherein:
the sense current control circuit includes:
  a reference power supply that generates a reference potential;
  a reference resistor connected in series to the sense MOS transistor; and
  an operational amplifier that generates an output at the gate of the sense MOS transistor so that a potential between the reference resistor and the sense MOS transistor approaches the reference potential; and
the sense current control circuit flows a current, determined by a resistance value of the reference resistor and the reference potential, as the drain current of the sense MOS transistor.

8. The drive device according to claim 6, wherein:
the sense current control circuit includes:
  an operational amplifier that generates an output at the gate of the sense MOS transistor;
  a current source that supplies a predetermined current to one input terminal of the operational amplifier; and
  a temperature sensitive element connected to the operational amplifier in parallel to the current source; and
the sense current control circuit changes the drain current of the sense MOS transistor based on a voltage drop in the temperature sensitive element that depends on temperature.

9. The drive device according to claim 6, wherein:
the plurality of main MOS transistors include at least three transistors connected to each other so as to reduce the gate current in a stepwise manner; and
the switch circuit transitionally changes the gate current when the switch circuit switches the gate current.

10. The drive device according to claim 6, wherein:
the current path includes at least two passages; and
the gate current varies by switching between the at least two passages with the switching circuit.

* * * * *